US012356838B2

United States Patent
Cao et al.

(10) Patent No.: US 12,356,838 B2
(45) Date of Patent: Jul. 8, 2025

(54) DISPLAY PANEL AND MANUFACTURING METHOD THEREOF

(71) Applicant: SHENZHEN CHINA STAR OPTOELECTRONICS SEMICONDUCTOR DISPLAY TECHNOLOGY CO., LTD., Guangdong (CN)

(72) Inventors: Weiran Cao, Guangdong (CN); Yunxia Li, Guangdong (CN)

(73) Assignee: SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 0 days.

(21) Appl. No.: 17/753,058

(22) PCT Filed: Dec. 30, 2021

(86) PCT No.: PCT/CN2021/143021
§ 371 (c)(1),
(2) Date: Feb. 16, 2022

(87) PCT Pub. No.: WO2023/123197
PCT Pub. Date: Jul. 6, 2023

(65) Prior Publication Data
US 2024/0040910 A1    Feb. 1, 2024

(30) Foreign Application Priority Data
Dec. 28, 2021   (CN) .......................... 202111621633.0

(51) Int. Cl.
*H01L 29/06* (2006.01)
*H01L 29/78* (2006.01)
(Continued)

(52) U.S. Cl.
CPC ....... *H10K 59/878* (2023.02); *H10K 59/1201* (2023.02); *H10K 59/122* (2023.02); *H10K 59/124* (2023.02)

(58) Field of Classification Search
CPC ............. H10K 59/878; H10K 59/1201; H10K 59/122; H10K 59/124; H10K 59/131; H10K 71/861
(Continued)

(56) References Cited

U.S. PATENT DOCUMENTS

2004/0110782 A1* 6/2004 LaVoie .................... A61P 35/00
546/61
2005/0009824 A1* 1/2005 LaVoie ................ C07D 491/14
544/233
(Continued)

FOREIGN PATENT DOCUMENTS

CN    109148739 A    1/2019
CN    110867465 A    3/2020
(Continued)

OTHER PUBLICATIONS

Japanese Office Action issued in corresponding Japanese Patent Application No. 特願 2022-500693 dated Feb. 27, 2024, pp. 1-5.
(Continued)

*Primary Examiner* — Sheikh Maruf
(74) *Attorney, Agent, or Firm* — PV IP PC; Wei Te Chung

(57) ABSTRACT

The present application discloses a display panel and a manufacturing method thereof. The display panel includes a substrate, a pixel definition layer and a light-emitting layer. The pixel definition layer is disposed on the substrate. The pixel definition layer is provided with a first through hole, the first through hole penetrates through the pixel definition layer, the light-emitting layer is disposed in the first through
(Continued)

hole, and an isolation layer is disposed between the light emitting layer and the pixel definition layer.

13 Claims, 7 Drawing Sheets

(51) Int. Cl.
    *H10K 59/12*         (2023.01)
    *H10K 59/122*       (2023.01)
    *H10K 59/124*       (2023.01)
    *H10K 59/80*        (2023.01)

(58) Field of Classification Search
    USPC .......................................................... 257/91
    See application file for complete search history.

(56) References Cited

U.S. PATENT DOCUMENTS

| | | | |
|---|---|---|---|
| 2005/0009825 A1* | 1/2005 | LaVoie | C07D 491/22 544/233 |
| 2006/0004008 A1* | 1/2006 | LaVoie | A61P 31/00 514/285 |
| 2009/0001360 A1* | 1/2009 | Nakayama | H10D 86/451 257/43 |
| 2012/0237531 A1* | 9/2012 | LaVoie | A61K 31/4738 424/178.1 |
| 2014/0329345 A1* | 11/2014 | Lee | H10K 59/12 438/18 |
| 2015/0091030 A1* | 4/2015 | Lee | H10K 59/122 438/34 |
| 2015/0102317 A1* | 4/2015 | Kim | H10K 10/466 438/22 |
| 2016/0118451 A1* | 4/2016 | Youn | H10D 30/6704 257/66 |
| 2017/0117506 A1* | 4/2017 | Hiraoka | H05B 44/00 |
| 2017/0301743 A1 | 10/2017 | Yang et al. | |
| 2019/0096968 A1* | 3/2019 | Zhang | H10K 50/115 |
| 2019/0326368 A1* | 10/2019 | Fan | H10K 71/00 |
| 2020/0203673 A1* | 6/2020 | Kwon | H10K 59/1201 |
| 2020/0303687 A1* | 9/2020 | Liu | H10K 71/80 |
| 2021/0066417 A1* | 3/2021 | Wang | H10K 59/123 |
| 2021/0273197 A1* | 9/2021 | Wang | H10K 50/844 |
| 2021/0367019 A1* | 11/2021 | Cheng | H10K 71/00 |

FOREIGN PATENT DOCUMENTS

| | | |
|---|---|---|
| CN | 111341937 A | 6/2020 |
| CN | 111403623 A | 7/2020 |
| CN | 111725422 A | 9/2020 |
| JP | 2006004781 A | 1/2006 |
| JP | 2017079160 A | 4/2017 |
| WO | 2020202293 A1 | 10/2020 |

OTHER PUBLICATIONS

International Search Report in International application No. PCT/CN2021/143021, mailed on Sep. 26, 2022.
Written Opinion of the International Searching Authority in International application No. PCT/CN2021/143021, mailed on Sep. 26, 2022.

* cited by examiner

DISPLAY PANEL AND MANUFACTURING METHOD THEREOF

BACKGROUND OF INVENTION

Field of Invention

The present application relates to a field of display technology, and in particular, to a display panel and a manufacturing method thereof.

Description of Prior Art

At present, a pixel definition layer (bank) is usually an organic material, which will release gases such as water and oxygen under an action of environmental factors such as a certain temperature or pressure. Referring to FIG. 1, in the existing device structure, a light-emitting layer is usually in direct contact with the bank, gases such as water and oxygen released from the bank can directly enter the light-emitting layer and react with a light-emitting material, resulting in failure of the light-emitting layer and causing a pixel to shrink. The main manifestation of pixel shrinkage is darkening of a periphery of the pixel, and in severe cases, it will lead to defects such as color shift and dark spots on the screen, which impacts the product yield and service life.

SUMMARY OF INVENTION

Embodiments of the present application provide a display panel and a manufacturing method thereof, so as to solve the problem in the prior art that gases such as water and oxygen in the pixel definition layer enter the light-emitting layer and cause the light-emitting layer to fail.

The present application provides a display panel, which includes:

- a substrate;
- a pixel definition layer, wherein the pixel definition layer is disposed on the substrate, the pixel definition layer is provided with a first through hole, and the first through hole penetrates the pixel definition layer; and
- light-emitting layers, wherein each of the light-emitting layers is disposed in the first through hole, and an isolation layer is disposed between the light-emitting layers and the pixel definition layer.

Optionally, in some embodiments of the present application, the isolation layer includes a metal layer.

Optionally, in some embodiments of the present application, the display panel is provided with a display area and a non-display area defined around the display area, the isolation layer further includes an oxide layer that is insulative, the oxide layer is disposed on a side of the metal layer away from the substrate, and the oxide layer is located at an end of the metal layer away from the display area, the display panel further includes an upper electrode and an electronic functional layer, the electronic functional layer is disposed on the light-emitting layers and the metal layer, the upper electrode is disposed on the electronic functional layer and the oxide layer, and an end of the upper electrode away from the display area is connected to the oxide layer.

Optionally, in some embodiments of the present application, the oxide layer is made of a metal oxide of a material of the metal layer, and the metal layer and the oxide layer are integrally formed.

Optionally, in some embodiments of the present application, the isolation layer covers the pixel definition layer and fills the first through hole.

Optionally, in some embodiments of the present application, a first via hole is defined in the isolation layer, the first via hole is located between adjacent ones of the light-emitting layers, and the first via hole penetrates the isolation layer.

Optionally, in some embodiments of the present application, the display panel further includes a transistor layer, a planarization layer, and a self-repairing layer, the transistor layer is disposed on the substrate, the planarization layer is disposed on the transistor layer, the pixel definition layer is disposed on the planarization layer, the pixel definition layer is further provided with a second through hole, the display panel is provided with a display area and a non-display area defined around the display area, the second through hole is defined in at least one of the display area or the non-display area, the second through hole is spaced apart from the first through hole, the second through hole communicates with the first via hole, and the second through hole penetrates the pixel definition layer and the planarization layer to expose the transistor layer, the isolation layer extends into the second through hole to contact the transistor layer, and the self-repairing layer is disposed on the isolation layer and extends into the second through hole to contact the transistor layer.

Optionally, in some embodiments of the present application, the isolation layer covers a sidewall of the first through hole.

Optionally, in some embodiments of the present application, the display panel further includes a transistor layer and a self-repairing layer, the transistor layer is disposed on the substrate, the pixel definition layer is disposed on the transistor layer, and the self-repairing layer is disposed in the transistor layer or on the isolation layer.

Optionally, in some embodiments of the present application, the self-repairing layer includes a self-repairing material, and the self-repairing material includes one or a combination of a microcapsule self-repairing polymer material, a hollow fiber self-repairing polymer material, a nanoparticle self-repairing material, and a microvascular self-repairing polymer material.

Optionally, in some embodiments of the present application, the self-repairing layer further includes a curing agent, the curing agent includes one or a combination of aliphatic amine, mercaptan, boron trifluoride, polythiol-pentaerythritol tetramercaptopropionate, benzyldimethylamine, azobisisobutyronitrile (AIBN), and metal ruthenium (Grubbs).

Optionally, in some embodiments of the present application, a surface of the self-repairing layer away from the substrate is a hydrophobic surface.

Optionally, in some embodiments of the present application, the hydrophobic surface is made of a hydrophobic material, and a mass ratio of the hydrophobic material to a repairing agent is 1-5%:1.

Optionally, in some embodiments of the present application, the display panel further includes a transistor layer and a self-repairing layer, the self-repairing layer and the transistor layer are sequentially stacked on the substrate.

Optionally, in some embodiments of the present application, the display panel further includes a transistor layer and a self-repairing layer, and the transistor layer, the self-repairing layer, and the pixel definition layer are sequentially stacked on the substrate.

Correspondingly, the present application also provides a method of manufacturing a display panel, including:

providing a substrate;

forming a pixel definition layer on the substrate, wherein the pixel definition layer is provided with a first through hole, and the first through hole penetrates the pixel definition layer;

forming an isolation layer on the pixel definition layer and located on a sidewall of the first through hole; and forming each of light-emitting layers in the first through hole, and the isolation layer is located between the light-emitting layers and the pixel definition layer.

Optionally, in some embodiments of the present application, the display panel is provided with a display area and a non-display area defined around the display area, and the step of forming the isolation layer on the pixel definition layer and located on a sidewall of the first through hole includes:

forming a metal on the pixel definition layer, and patterning the metal to form a metal layer of the isolation layer, wherein the metal layer is located on the sidewall of the first through hole, and an end of the metal layer is located on a side of the metal layer away from the display area; and performing oxidization on a surface of the end of the metal layer away from the substrate to form an oxide layer that, wherein after the step of forming each of the light-emitting layers in the first through hole, the method of manufacturing the display panel includes:

forming an electronic functional layer on the light-emitting layers and the pixel definition layer; and forming an upper electrode on the electronic functional layer and the oxide layer, wherein an end of the upper electrode is located on a side of the upper electrode away from the display area, and the end of the upper electrode is connected to the oxide layer.

Optionally, in some embodiments of the present application, the oxide layer is made of a metal oxide of a material of the metal layer, and the metal layer and the oxide layer are integrally formed.

Optionally, in some embodiments of the present application, the step of forming the isolation layer on the pixel definition layer and located on a sidewall of the first through hole includes:

forming a metal on the pixel definition layer, patterning the metal to form a metal layer of the isolation layer, and the metal layer is located on the sidewall of the first through hole; and forming an oxide layer that is insulative on the metal layer, wherein a material of the metal layer includes one or a combination of aluminum, magnesium, zinc, nickel, lead, silver, copper, and iron, and a material of the oxide layer includes one or a combination of aluminum oxide, magnesium oxide, zinc oxide, nickel oxide, tin dioxide, lead oxide, iron oxide, silver oxide, and copper oxide.

Optionally, in some embodiments of the present application, after forming the isolation layer on the pixel definition layer, the method of manufacturing the display panel further includes:

forming a self-repairing layer on the isolation layer.

The present application discloses a display panel and a manufacturing method thereof. The display panel includes a substrate, a pixel definition layer, and a light-emitting layer. The pixel definition layer is disposed on the substrate. The pixel definition layer is provided with a first through hole, and the first through hole penetrates through the pixel definition layer, the light-emitting layer is disposed in the first through hole, and an isolation layer is disposed between the light-emitting layer and the pixel definition layer. In this application, the isolation layer is disposed between the light-emitting layer and the pixel definition layer to prevent water and oxygen in the pixel definition layer from entering the light-emitting layer, thereby preventing the light-emitting layer from failure, thereby preventing the problem of darkening or shrinking of periphery of the pixel, thereby improving the performance of the display panel.

BRIEF DESCRIPTION OF DRAWINGS

In order to more clearly illustrate the technical solutions of the embodiments of the application, the drawings illustrating the embodiments will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Figure 1:
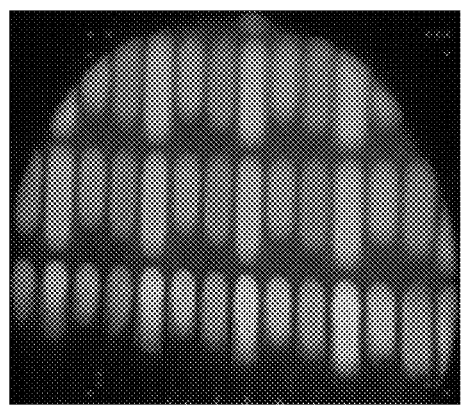
FIG. 1 is a schematic view of an electron microscope of a light-emitting layer in a display panel provided in the prior art.

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application. In addition, it should be understood that the specific implementations described here are only used to illustrate and explain the application, and are not used to limit the application. In the present application, unless otherwise stated, the orientation terms used such as "upper" and "lower" generally refer to the upper and lower directions of the device in actual use or working state, and specifically refer to the drawing directions in the drawings, while "inner" and "outer" refer to the outline of the device. In this application, a "reaction" can be a chemical reaction or a physical reaction.

Embodiments of the present application provide a display panel and a manufacturing method thereof. The display panel includes a substrate, a pixel definition layer, a light-emitting layer, and an isolation layer. The pixel definition layer is disposed on the substrate, the pixel definition layer is provided with a first through hole, the first through hole penetrates the pixel definition layer, the light-emitting layer is disposed in the first through hole, and an isolation layer is disposed between the light-emitting layer and the pixel definition layer.

In this application, by disposing an isolation layer between the light-emitting layer and the pixel definition layer, gases such as water and oxygen in the pixel definition layer can be prevented from entering the light-emitting layer, thereby preventing the light-emitting layer from failure due to erosion by water and oxygen, preventing shrinkage problem of the pixel, thereby improving the performance of the display panel.

Figure 2:
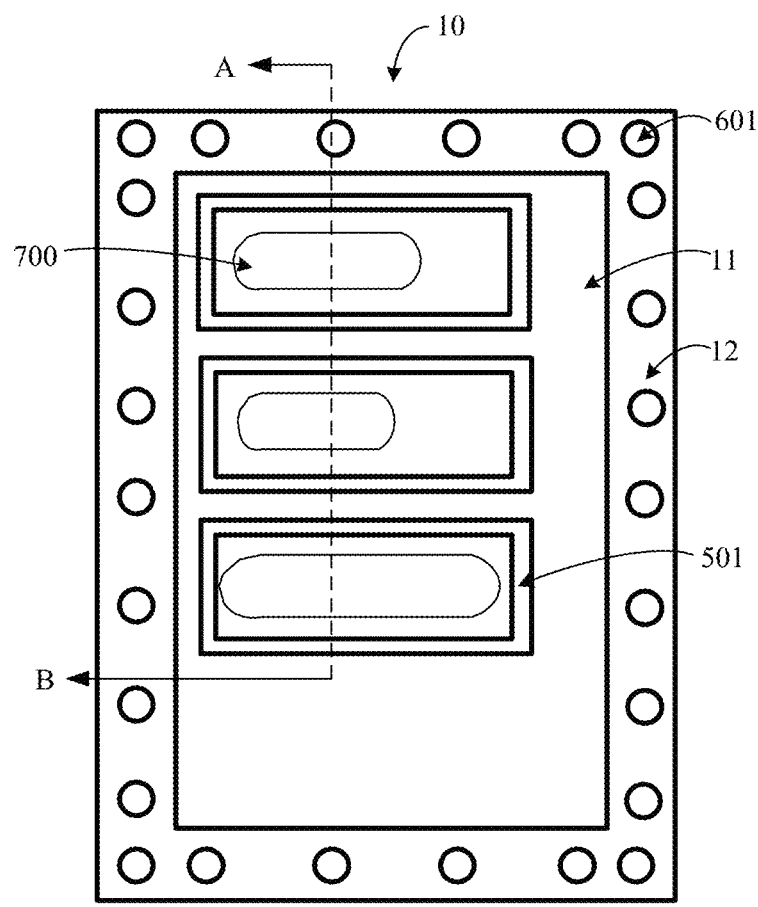
FIG. 2 is a schematic plan view of a display panel provided by an embodiment of the present application.
Figure 3:
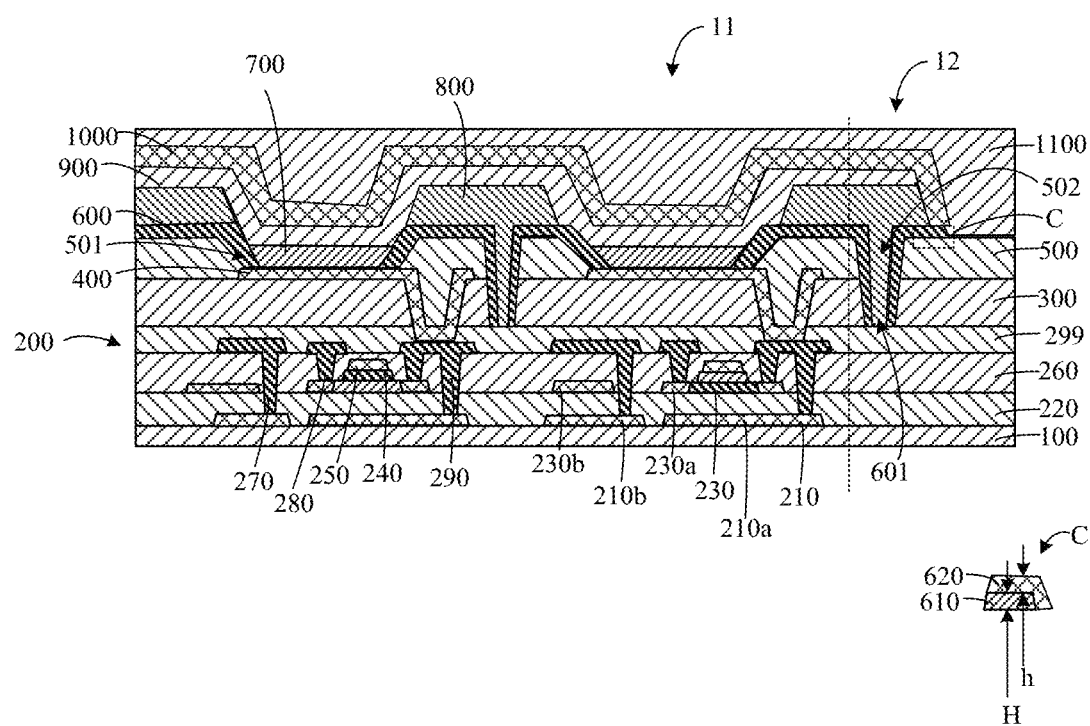
FIG. 3 is a schematic cross-sectional view of the display panel taken along line A-B in FIG. 2.

Details are described as follows:

Referring to FIG. 2 and FIG. 3, the present application provides a display panel 10. The display panel 10 includes a substrate 100, a transistor layer 200, a planarization layer 300, a lower electrode 400, a pixel definition layer 500, an isolation layer 600, a light-emitting layer 700, a self-repairing layer 800, an electronic functional layer 900, an upper electrode 1000, and an encapsulation layer 1100, which are stacked in sequence. The display panel 10 is provided with a display area 11 and a non-display area 12 provided around the display area 11.

A number of transistor layers 200 is plural. The transistor layers 200 are disposed on the substrate 100 at intervals. Specifically, each of the transistor layers 200 includes a light-shielding layer 210, a buffer layer 220, an active layer 230, an insulating layer 240, a gate electrode 250, an interlayer dielectric layer 260, a connection portion 270, a source electrode 280, a drain electrode 290, and a passivation layer 299. The light-shielding layer 210 is disposed on the substrate 100. The light-shielding layer 210 includes a light-shielding portion 210a and a metal portion 210b spaced apart from each other. The light-shielding layer 210 is configured to shield external light to prevent an influence of light on the active layer 230, thereby improving performance of the transistors. The metal portion 210b is a part of a first plate of a capacitor. The buffer layer 220 covers the light-shielding layer 210 and the substrate 100. The active layer 230 is disposed on the buffer layer 220. The active layer 230 includes an active portion 230a and a conduction portion 230b which are spaced apart from each other. The active portion 230a is located on the light-shielding portion 210a. The conduction portion 230b is located on the metal portion 210b, and the active portion 230a includes a semiconductor portion and conductor portions disposed on opposite sides of the semiconductor portion. The conduction portion 230b is a second plate of the capacitor. The insulating layer 240 is disposed on the active portion 230a and on the semiconductor portion. The gate 250 is disposed on the insulating layer 240. The interlayer dielectric layer 260 covers the active layer 230, the insulating layer 240, and the gate electrode 250. The source electrode 280, the drain electrode 290, and the connection portion 270 are disposed on the interlayer dielectric layer 260 in the same layer and spaced apart from one another, wherein the connection portion 270 is located on the conduction portion 230b, and the connection portion 270 extends into a connection hole and is connected to the metal portion 210b. The source electrode 280 extends into another connection hole and is connected to a conductor portion. The drain electrode 290 extends into yet another connection hole and is connected to another conductor portion. The connection portion 270 is a part of the first plate of a storage capacitor. The passivation layer 299 covers the buffer layer 220, the connection portion 270, the source electrode 280, and the drain electrode 290.

In the present application, the metal portion 210b and the connection portion 270 constitute the first electrode plate of the capacitor, so that an overlapping area between the first electrode plate and the second electrode plate is increased, a capacitance value of the storage capacitor is increased, and performance of the display panel 10 is improved.

The planarization layer 300 is disposed on the passivation layer 299. The planarization layer 300 is provided with a connection hole, and the connection hole of the planarization layer 300 penetrates through the planarization layer 300 and the passivation layer 299 to expose the drain electrode 290.

The lower electrode 400 is disposed on the planarization layer 300, and extends into the connection hole of the planarization layer 300 to connect the drain electrode 290. Optionally, the lower electrode 400 may be an anode.

The pixel definition layer 500 is disposed on the lower electrode 400 and the planarization layer 300. The pixel definition layer 500 is provided with a first through hole 501 and a second through hole 502. The first through hole 501 penetrates through the pixel definition layer 500 to expose the lower electrode 400. The second through hole 502 penetrates through the pixel definition layer 500 and the planarization layer 300 to expose the passivation layer 299.

In the present application, the pixel definition layer 500 is provided with the second through hole 502. In the present application, by arranging the second through hole 502 in the pixel definition layer 500, the stress occurring during use or preparation can be buffered, thereby preventing a problem of film breakage in the display panel 10, thereby improving the performance of the display panel 10.

The isolation layer 600 is disposed between the light-emitting layer 700 and the pixel definition layer 500. Specifically, the isolation layer 600 covers the sidewall of the first through hole 501. Optionally, the isolation layer 600 includes a metal layer 610. The metal layer 610 is disposed between the pixel definition layer 500 and the light-emitting layer 700. Optionally, the isolation layer 600 can also be made of other materials, such as inorganic materials capable of isolating gases such as water and oxygen.

In this application, metal is used to form the metal layer 610 in the isolation layer 600 between the pixel definition layer 500 and the light-emitting layer 700, so that the isolation layer 600 can prevent gas such as water and oxygen in the pixel definition layer 500 from entering the light-emitting layer 700, and meanwhile the metal layer 610 in the isolation layer 600 is formed of metal, so that the metal layer 610 has a reflective effect, thereby preventing the emitted light from spreading around, thereby improving a light extraction rate of the display panel 10 and further improving a display effect of the display panel 10.

In one embodiment, the isolation layer 600 covers the pixel definition layer 500 and fills the first through hole 501. Meanwhile, the subsequent light-emitting layer 700 is disposed on the metal layer 610, that is, the subsequent light-emitting layer 700 is in direct contact with the metal layer 610.

In one embodiment, when the isolation layer 600 covers the pixel definition layer 500 and fills the first through hole 501, the isolation layer 600 is provided with the first via hole 601. The first via hole 601 penetrates through the isolation layer 600 to expose the passivation layer 299, and the first via hole 601 communicates with the second through hole 502.

In the present application, when the isolation layer 600 covers the pixel definition layer 500 and fills the first through hole 501, the first through hole 601 is provided on the isolation layer 600, so that the isolation layer 600 is disconnected to form a plurality of spacers arranged at intervals, that is, a plurality of metal portions arranged at intervals are formed, so as to prevent the metal layer 610 from being in contact with the lower electrodes 400 and causing conduction between the adjacent lower electrodes 400, so as to prevent short circuit phenomenon. After the pixel fails due to water, oxygen, and other gases, the water, oxygen, and other gases cannot pass through the isolation layer to impact other sub-pixels due to the arrangement of the spacers, ensuring a normal operation of other sub-pixels, thereby improving a performance of the display panel 10.

In one embodiment, when the isolation layer 600 covers the pixel definition layer 500 and fills the first through hole 501, the isolation layer 600 is further provided with a second via hole 602, and the second via hole 602 penetrates through the isolation layer 600 to expose the lower electrode 400, that is, the second via hole 602 penetrates through the metal layer 610, and the second via hole 602 communicates with the first through hole 501.

In the present application, when the isolation layer 600 covers the pixel definition layer 500 and fills the first through hole 501, the isolation layer 600 is also provided with a second via hole 602 communicating with the first through hole 501, so that the subsequent light-emitting layer 700 can be provided with the first through hole 501 and the second via hole 602 are connected to the lower electrode 400, that is, the light-emitting layer 700 is in direct contact with the lower electrode 400, so that energy levels between the subsequent light-emitting layer 700 and the lower electrode 400 and the metal layer 610 are matched, so that holes are easily injected, thereby improving a light extraction efficiency of the display panel 10, and meanwhile, preventing an influence of a microcavity effect.

In one embodiment, a material of the metal layer 610 is an easily oxidized metal.

It should be noted that the easily oxidized metal refers to a metal that is more prone to oxidation reaction in air.

In one embodiment, the material of the metal layer 610 includes one or a combination of aluminum, magnesium, zinc, nickel, lead, silver, copper, and iron.

In one embodiment, a thickness H of the metal layer 610 is 50-800 nanometers.

An oxide layer 620 is disposed on a side of the metal layer 610 away from the substrate 100. The oxide layer 620 is located at an end C of the metal layer 610 away from the display area 11, and the end C of the metal layer 610 is located at the side of the metal layer 610 away from the light-emitting layer 700.

In the present application, the oxide layer 620 is provided on the side of the metal layer 610 away from the substrate 100 to prevent the subsequent connection between the upper electrode 1000 and the metal layer 610 when the subsequent electronic functional layer 900 does not completely cover the lower electrode 400, thereby preventing short circuit, and thereby ensuring the performance of the display panel 10. Also, the oxide layer 620 is only disposed on the end C of the metal layer 610 away from the display area 11, which can reduce the cost.

In one embodiment, the oxide layer 620 is provided on the side of the metal layer 610 away from the substrate 100. The isolation layer 600 here refers to the metal layer 610 and the oxide layer 620, and the first via hole 601 penetrates through the oxide layer 620 and the metal layer 610 to expose the passivation layer 299, the first via hole 601 is connected to the second through hole 502, and the second via hole 602 communicates with the first through hole 501, so that the metal layer 610 is formed into a plurality of metal portions arranged at intervals and the oxide layer 620 is formed into a plurality of oxide portions arranged at intervals.

In the present application, the oxide layer 620 is disposed on all the surface of the metal layer 610 away from the substrate 100, that is, the oxide layer 620 is on the entire surface of the metal layer 610, which simplifies the preparation process of the display panel 10, and meanwhile, prevents the metal layer 610 from contacting with the subsequent upper electrode 1000, thereby ensuring the performance of the display panel 10.

In one embodiment, a material of the oxide layer 620 includes one or a combination of aluminum oxide, magnesium oxide, zinc oxide, nickel oxide, tin oxide, lead oxide, iron oxide, silver oxide, and copper oxide.

In one embodiment, a material of the oxide layer 620 is a metal oxide of the material of the metal layer 610, and the material of the oxide layer 620 includes one or a combination of aluminum oxide, magnesium oxide, zinc oxide, nickel oxide, tin dioxide, lead oxide, iron oxide, silver oxide, and copper oxide. As an example, the material of the metal layer is aluminum, and the material of the oxide layer is aluminum oxide; or, the material of the metal layer is lead, and the material of the oxide layer is lead oxide; or, the material of the metal layer is silver, and the material of the oxide layer is silver oxide; and so on.

In this application, the material of the oxide layer 620 is a metal oxide of the material of the metal layer 610, so that when the metal layer 610 and the oxide layer 620 are prepared, the metal layer 610 and the oxide layer 620 can be integrally formed, which simplifies the preparation process of the isolation layer 600, facilitates a rapid preparation of the isolation layer 600, and reduces the production cost.

In one embodiment, a thickness h of the oxide layer 620 is 10-20 nanometers.

The light-emitting layer 700 is disposed in the first through hole 501 and the second via hole 602 to connect the lower electrode 400, that is, the light-emitting layer 700 is in direct contact with the lower electrode 400, thereby reducing an energy level difference between the light-emitting layer 700 and the lower electrode 400 and the metal layer, which makes it easy for holes to be injected into the light-emitting layer 700, thereby improving a light extraction efficiency of the display panel 10 and preventing an influence of the microcavity effect.

The self-repairing layer 800 is disposed on the isolation layer 600 and extends into the second through hole 502 to contact the transistor layer 200. Specifically, when the oxide layer 620 is disposed on the side of the metal layer 610 away from the substrate 100, the self-repairing layer 800 is disposed on the oxide layer 620 and extends into the first via hole 601 and the second through hole 502 to contact with the passivation layer 299, and the self-repairing layer 800 is disposed around the first through hole 501 to form a plurality of self-repairing portions arranged at intervals.

In the present application, the self-repairing layer 800 is disposed on the isolation layer 600 and extends into the first via hole 601 and the second through hole 502 to contact the passivation layer 299, so that the self-repairing layer 800 can automatically repair cracks present in the display panel 10 during the preparation and use, so as to prevent the problem of film breakage. Meanwhile, the setting of the second through hole 502 and the first via hole 601 can buffer the stress occurring during use or the preparation process, thereby preventing layers in the display panel 10 from breakage, thereby improving the performance of the display panel 10.

In one embodiment, the self-repairing layer 800 includes a repairing agent, that is, a self-repairing material. The repairing agent includes one or several combinations of extrinsic self-repairing polymer materials and intrinsic self-repairing polymer materials. Specifically, extrinsic self-repairing polymer materials include one or several combinations of microcapsule self-repairing polymer materials, hollow fiber self-repairing polymer materials, nanoparticle self-repairing polymer materials, microvascular self-repairing polymer materials, and carbon nanotube self-repairing polymer materials. The microcapsule self-repairing polymer material includes one or several combinations of polymer materials of dicyclopentadiene (DCPD) self-repairing agent system and epoxy resin self-repairing agent system. The repairing agent is a low-viscosity liquid, and has good wettability to a fracture surface, so that the repairing agent can be encapsulated in a particle.

In one embodiment, the material of the self-repairing layer 800 further includes a curing agent. The curing agent is a room temperature curing agent. The curing agent includes one or several combinations of aliphatic amine, mercaptan, boron trifluoride, polythiol-pentaerythritol tetramercaptopropionate, benzyl dimethylamine, azobisisobutyronitrile (AIBN), and metal ruthenium (Grubbs). The curing agent may be encapsulated in the particle containing the self-repairing agent, or not provided in the particle containing the self-repairing agent. It should be noted that the curing agent does not react with a layer.

Figure 4:
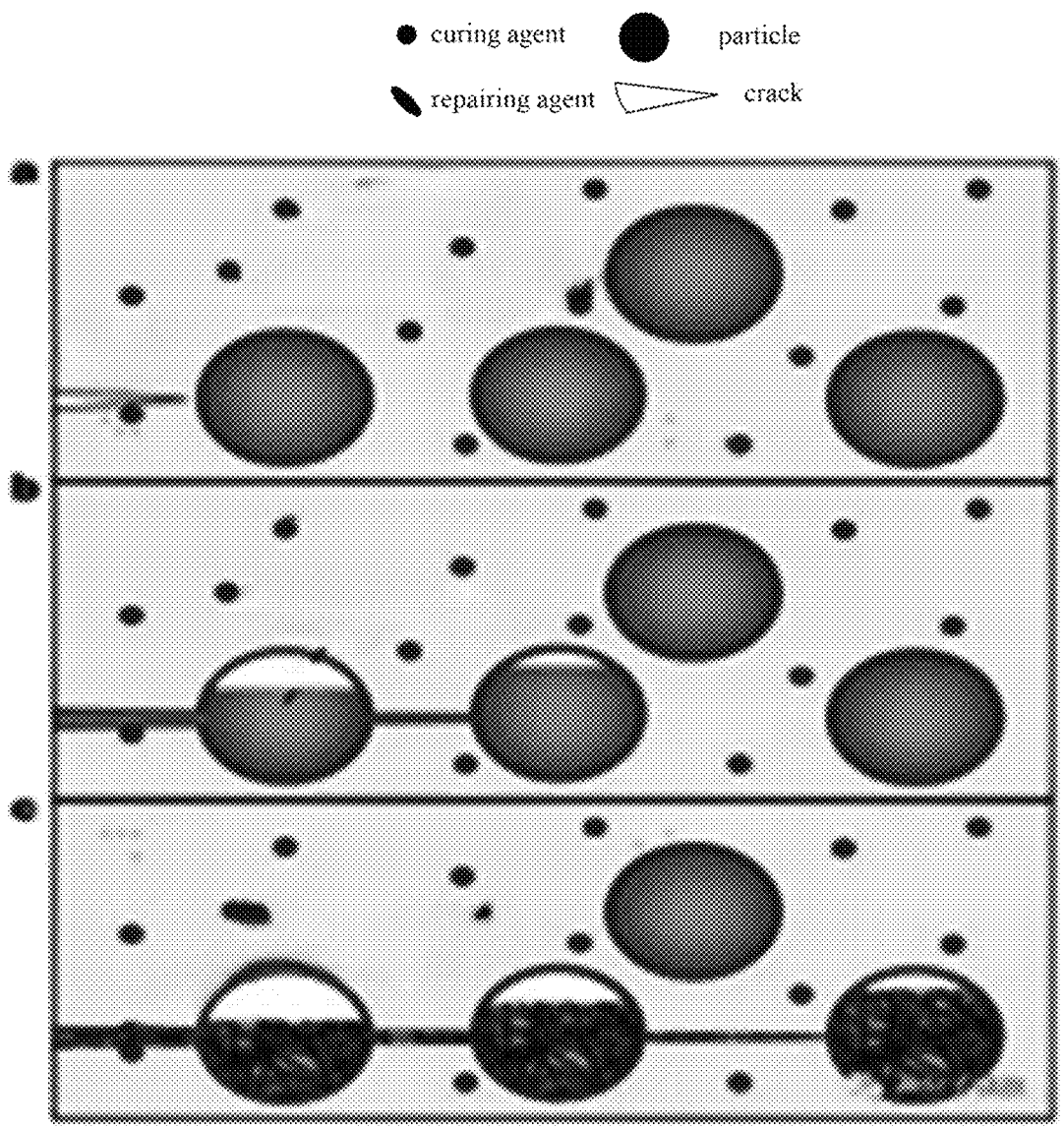
FIG. 4 is a schematic diagram of a principle of repairing film cracks by a self-repairing layer provided in an embodiment of the present application.
Figure 5:
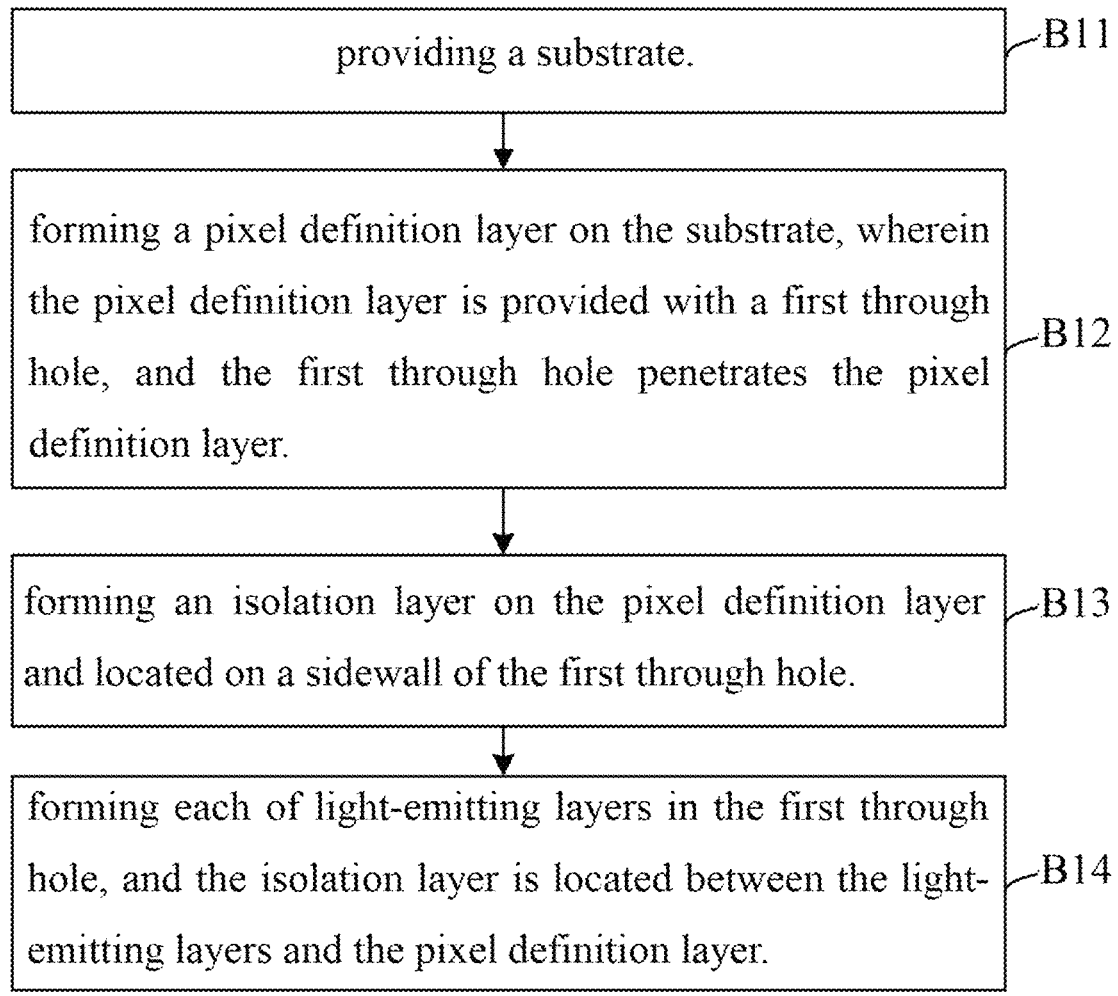
FIG. 5 is a schematic flowchart of a method of fabricating a display panel provided by an embodiment of the present application.

Referring to FIG. 4, repairing principle is as follows: propagation of a crack in the layer causes the particle containing the repairing agent to rupture, and the repairing agent in the particle flows to the crack under an action of capillary action, and the repairing agent undergoes a polymerization reaction under an action of the curing agent, thereby repairing the crack.

For example, the polymer material of dicyclopentadiene (DCPD) self-repairing agent system is dicyclopentadiene (DCPD) and a metal ruthenium (Grubbs) catalyst, DCPD can undergo a ring-opening metathesis polymerization reaction with the Grubbs catalyst to repair the crack, thus achieving self-repairing.

In one embodiment, a surface of the self-repairing layer 800 away from the substrate 100 is a hydrophobic surface. A material of the hydrophobic surface is a hydrophobic material. Hydrophobic materials include fluorine-containing compounds. In the present application, the hydrophobic material is added to the self-repairing layer 800, and the hydrophobic material floats on the surface of the self-repairing layer 800 during the use or preparation of the display panel 10 to form a hydrophobic surface, so that the surface of the self-repairing layer 800 forms a hydrophobic surface. The hydrophobic surface with hydrophobic effect can prevent the phenomenon of color mixing between adjacent light-emitting layers 700 during the process of preparing the light-emitting layer 700, thereby improving the performance of the display panel 10.

In one embodiment, a mass ratio of the hydrophobic material to the repairing agent is 1-5%:1. Controlling the mass ratio within this range can improve a hydrophobic effect of the self-repairing layer 800, thereby improving the performance of the display panel 10.

In another embodiment, the self-repairing layer 800 is disposed in the transistor layer 200, between the substrate 100 and the transistor layer 200, and between the transistor layer 200 and the pixel definition layer 500.

In another embodiment, the self-repairing layer 800 is disposed in the transistor layer 200, disposed between the substrate 100 and the transistor layer 200, disposed between the transistor layer 200 and the pixel definition layer 500, or disposed between the pixel definition layer 500 and the isolation layer 600.

In the present application, the self-repairing layer 800 is further disposed in the transistor layer 200, disposed between the substrate 100 and the transistor layer 200, and disposed between the transistor layer 200 and the pixel definition layer 500, so that the self-repairing layer 800 can also repair cracks in layers other than those adjacent to the self-repairing layer 800, thereby further improving bending performance of the display panel 10.

An electronic functional layer 900 is disposed on the light-emitting layer 700 and the metal layer 610, the upper electrode 1000 is disposed on the electronic functional layer 900 and the oxide layer 620, and the end C of the upper electrode 1000 away from the display area 11 is connected to the oxide layer 620. Specifically, the electronic functional layer 900 includes an electron injection layer and an electron transport layer. The electron transport layer covers the oxide layer 620, the light-emitting layer 700 and the self-repairing layer 800. The electron injection layer is disposed on the electron transport layer, and the upper electrode 1000 is disposed on the electron injection layer and the oxide layer 620. The upper electrode 1000 may be a cathode.

The encapsulation layer 1100 is disposed on the upper electrode 1000.

It should be noted that the substrate 100, the transistor layer 200, the planarization layer 300, the lower electrode 400, the self-repairing layer 800, the electronic functional layer 900, the upper electrode 1000, and the encapsulation layer 1100 in the display panel 10 can be removed as required.

The present application provides a display panel 10. By disposing an isolation layer 600 between the light-emitting layer 700 and the pixel definition layer 500, gases such as water and oxygen in the pixel definition layer 500 is prevented from entering the light-emitting layer 700, thereby preventing the light-emitting layer 700 from failure, and preventing the shrinkage problem of the pixel, thus improving a performance of the display panel 10; the self-repairing layer 800 is disposed in the display panel 10, so that the self-repairing layer 800 can repair the cracks in the display panel 10 during use or preparation process, thereby improving the bending performance of the display panel 10, thus improving the performance of the display panel 10.

The present application also provides a method of manufacturing a display panel, including:

B11, providing a substrate.

B12, forming a pixel definition layer on the substrate, wherein the pixel definition layer is provided with a first through hole, and the first through hole penetrates the pixel definition layer.

B13, forming an isolation layer on the pixel definition layer and located on a sidewall of the first through hole.

B14. forming each of light-emitting layers in the first through hole, and the isolation layer is located between the light-emitting layers and the pixel definition layer.

In the present application, by disposing an isolation layer between the light-emitting layer and the pixel definition layer, gases such as water and oxygen in the pixel definition layer can be prevented from entering the light-emitting layer, thereby preventing the light-emitting layer from failing, thereby preventing the shrinkage problem of the pixel, thereby improving the performance of the display panel.

The specific are described as follows:

Referring to FIG. 5 and FIG. 6 to FIG. 12, the present application further provides a method of manufacturing a display panel.

B11. providing a substrate.

Figure 6:
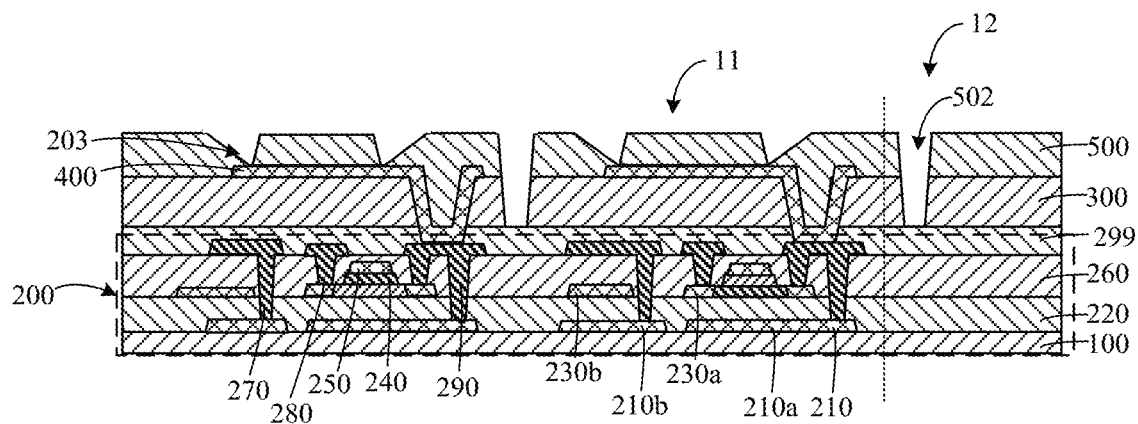
FIGS. 6-12 are schematic diagrams of steps of a method of manufacturing a display panel provided by an embodiment of the present application.

In an embodiment, after B11, the method of manufacturing the display panel further includes:

Referring to FIG. 6, a plurality of transistor layers 200 are formed on the substrate 100, and each of the transistor layers 200 includes a light-shielding layer 210, a buffer layer 220, an active layer 230, an insulating layer 240, a gate electrode 250, an interlayer dielectric layer 260, a connection portion 270, a source electrode 280, a drain electrode 290, and a passivation layer 299. The light-shielding layer 210 is disposed on the substrate 100. The light-shielding layer 210 includes a light-shielding portion 210a and a metal portion 210b spaced apart from each other. The light-shielding layer 210 is configured to shield external light to prevent an influence of light on the active layer 230, thereby improving performance of the transistors. The metal portion 210b is a part of a first plate of a capacitor. The buffer layer 220 covers the light-shielding layer 210 and the substrate 100. The active layer 230 is disposed on the buffer layer 220. The active layer 230 includes an active portion 230a and a conduction portion 230b which are spaced apart from each other. The active portion 230a is located on the light-shielding portion 210a. The conduction portion 230b is located on the metal portion 210b, and the active portion 230a includes a semiconductor portion and conductor portions disposed on opposite sides of the semiconductor portion. The conduction portion 230b is the second plate of the capacitor. The insulating layer 240 is disposed on the active portion 230a and on the semiconductor portion. The gate 250 is disposed on the insulating layer 240. The interlayer dielectric layer 260 covers the active layer 230, the insulating layer 240, and the gate electrode 250. The source electrode 280, the drain electrode 290, and the connection portion 270 are disposed on the interlayer dielectric layer 260 in the same layer and spaced apart from one another, wherein the connection portion 270 is located on the conduction portion 230b, and the connection portion 270 extends into a connection hole and is connected to the metal portion 210b. The source electrode 280 extends into another connection hole and is connected to a conductor portion. The drain electrode 290 extends into yet another connection hole and is connected to another conductor portion. The connection portion 270 is a part of the first plate of a storage capacitor. The passivation layer 299 covers the buffer layer 220, the connection portion 270, the source electrode 280, and the drain electrode 290.

In one embodiment, after the transistor layer 200 is formed on the substrate 100, the method further includes:

forming a planarization layer 300 on the passivation layer 299. The planarization layer 300 is provided with a connection hole, and the connection hole penetrates through the planarization layer 300 and the passivation layer 299 to expose the drain electrode 290.

In one embodiment, after the planarization layer 300 is formed on the passivation layer 299, the method further includes:

forming a lower electrode 400 on the planarization layer 300, wherein the lower electrode 400 extends into the connection hole to connect the drain electrode 290.

B12. forming a pixel definition layer on the substrate, wherein the pixel definition layer is provided with a first through hole, and the first through hole penetrates the pixel definition layer.

Still referring to FIG. 6. Specifically, the pixel definition layer 500 is formed on the planarization layer 300 and the lower electrode 400, and the pixel definition layer 500 is half-etched, so that a prefabricated hole 203 and a second through hole 502 are formed in the pixel definition layer 500. The prefabricated hole 203 penetrates through the pixel definition layer 500 to expose the lower electrode 400 and is defined on the lower electrode 400 while the pixel definition layer 500 located on the lower electrode 400 is reserved. The second through hole 502 penetrates through the pixel definition layer 500 and the planarization layer 300 to expose the passivation layer 299.

In the present application, the pixel definition layer 500 located on the lower electrode 400 is reserved to prevent damage to the lower electrode 400 during subsequent etching, thereby ensuring the performance of the display panel 10.

B13, forming an isolation layer on the pixel definition layer and located on the sidewall of the first through hole.

Figure 7:
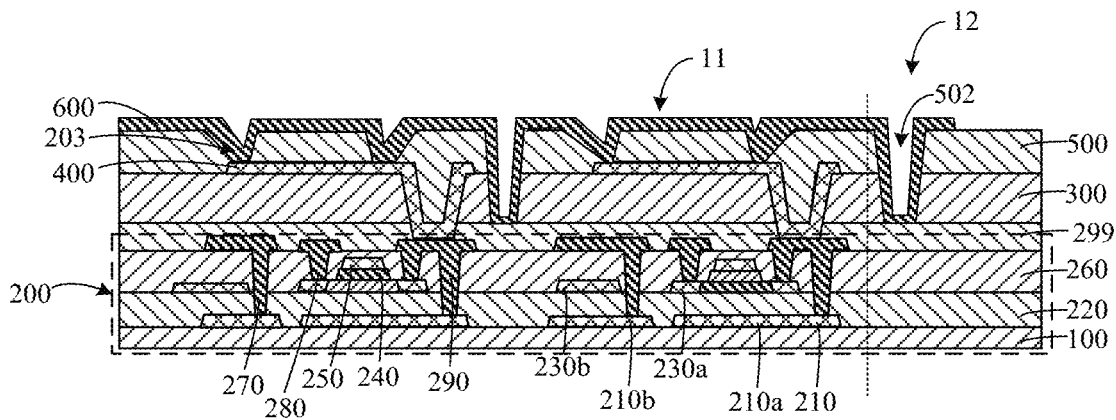
Figure 8:
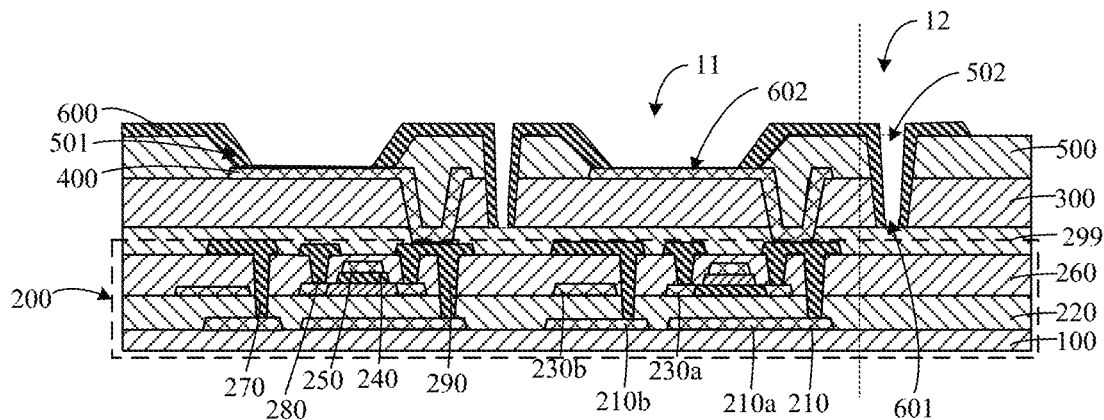

Referring to FIG. 7 and FIG. 8, specifically, a layer of metal is deposited on the lower electrode 400, the passivation layer 299, and the pixel definition layer 500 by magnetron sputtering or evaporation, and patterned to form the metal layer 610 in the isolation layer 600. The metal layer 610 extends into the second through hole 502 to contact the passivation layer 299.

Then, the metal layer 610 of the isolation layer 600 located on the lower electrode 400 and the isolation layer 600 located on the planarization layer 300 is removed by etching or the like, and the first through hole 501 and the second through hole 602 are formed from the prefabricated hole 203 to expose the lower electrode 400. Then, the upper surface of the metal layer 610 is treated with a plasma method, and the insulating oxide layer 620 is formed on the upper surface of the metal layer 610, that is, the upper surface of the metal layer 610 is oxidized. The isolation layer 600 is provided with a first via hole 601 and a second via hole 602, where the isolation layer 600 here refers to the metal layer 610 and the oxide layer 620, and the first via hole 601 penetrates through the oxide layer 620 and the metal layer 610 to expose the passivation layer 299, the first via hole 601 is connected to the second through hole 502, and the second via hole 602 communicates with the first through hole 501, so that the metal layer 610 is formed into a plurality of metal portions arranged at intervals and the oxide layer 620 is formed into a plurality of oxide portions arranged at intervals.

In one embodiment, the isolation layer 600 located on the sidewall of the first through hole 501 can also be removed, that is, only the isolation layer 600 located on the sidewall of the first through hole 501 is remained, which can save a raw material of the isolation layer 600.

In one embodiment, the material of the metal layer 610 is an easily oxidized metal.

In one embodiment, the material of the metal layer 610 is one or combinations of aluminum, magnesium, zinc, nickel, lead, silver, copper, and iron.

In one embodiment, the thickness H of the metal layer 610 is 50-800 nanometers.

In one embodiment, a material of the oxide layer 620 is a metal oxide of the material of the metal layer 610, and the material of the oxide layer 620 includes one or a combination of aluminum oxide, magnesium oxide, zinc oxide, nickel oxide, tin dioxide, lead oxide, iron oxide, silver oxide, and copper oxide. As an example, the material of the metal layer is aluminum, and the material of the oxide layer is aluminum oxide; or, the material of the metal layer is lead, and the material of the oxide layer is lead oxide; or, the material of the metal layer is silver, and the material of the oxide layer is silver oxide; and so on.

In another embodiment, a method of forming the oxide layer 620 further includes: directly disposing an insulating oxide layer 620 on the metal layer 610, that is, the oxide layer 620 is not formed by oxidizing the metal layer 610. As an example, a material of the metal layer is lead, and a material of the oxide layer is aluminum oxide; or, the material of the metal layer is aluminum, and the material of the oxide layer is lead oxide; or, the material of the metal layer is iron, and the material of the oxide layer is silver oxide and so on.

Figure 9:
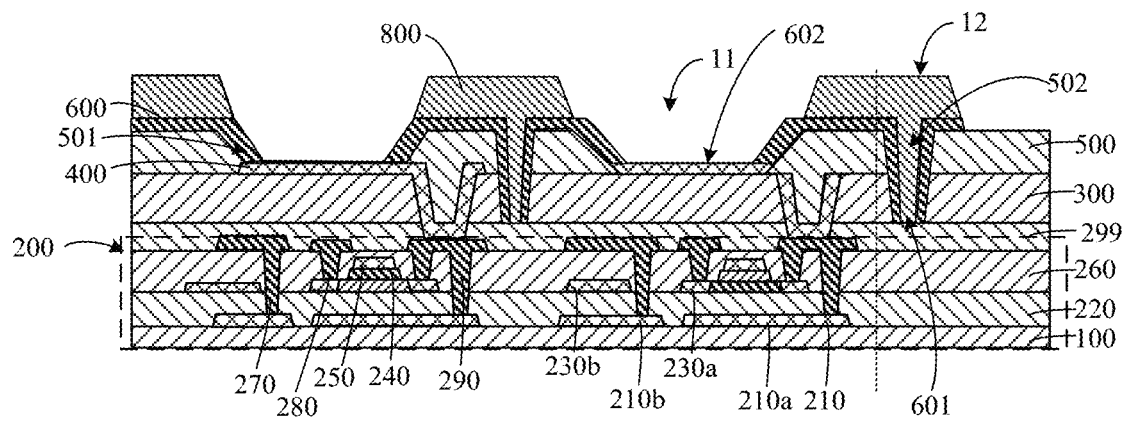

In an embodiment, after B13, the method further includes:

Refers to FIG. 9. A self-repairing layer 800 is formed on the oxide layer 620 and extends into the first via hole 601 and the second through hole 502 to contact the passivation layer 299. Specifically, the self-repairing layer 800 is disposed on the oxide layer 620 and extends into the first via hole 601 and the second through hole 502 to contact the passivation layer 299, and the self-repairing layer 800 is disposed around the first through hole 501 to form a plurality of self-repairing portions arranged at intervals.

In one embodiment, the self-repairing layer 800 includes a repairing agent, that is, a self-repairing material. The repairing agent includes one or several combinations of extrinsic self-repairing polymer materials and intrinsic self-repairing polymer materials. Specifically, extrinsic self-repairing polymer materials include one or several combinations of microcapsule self-repairing polymer materials, hollow fiber self-repairing polymer materials, nanoparticle self-repairing polymer materials, microvascular self-repairing polymer materials, and carbon nanotube self-repairing polymer materials. The microcapsule self-repairing polymer material includes one or several combinations of polymer materials of dicyclopentadiene (DCPD) self-repairing agent system and epoxy resin self-repairing agent system. The repairing agent is a low-viscosity liquid, and has good wettability to a fracture surface, so that the repairing agent can be encapsulated in a particle.

In one embodiment, the material of the self-repairing layer 800 further includes a curing agent. The curing agent is a room temperature curing agent. The curing agent includes one or several combinations of aliphatic amine, mercaptan, boron trifluoride, polythiol-pentaerythritol tetra-mercaptopropionate, benzyl dimethylamine, azobisisobutyronitrile (AIBN), and metal ruthenium (Grubbs). The curing agent may be encapsulated in the particle containing the self-repairing agent, or not provided in the particle containing the self-repairing agent. It should be noted that the curing agent does not react with a layer.

B14. forming a light-emitting layer in the first through hole, wherein the isolation layer is located between the light-emitting layer and the pixel definition layer.

Figure 10:
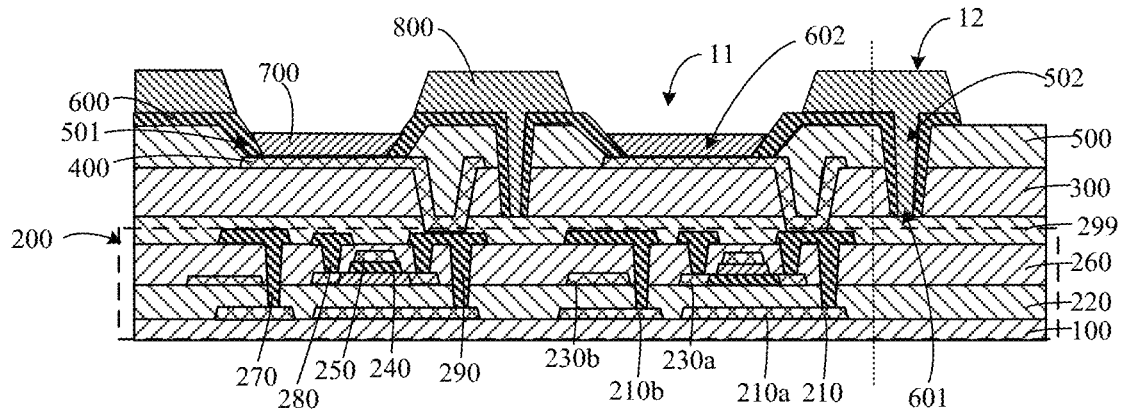

Referring to FIG. 10, specifically, a light-emitting layer 700 is disposed in the first through hole 501, and the light-emitting layer 700 is in contact with the lower electrode 400 and the isolation layer 600.

Figure 11:
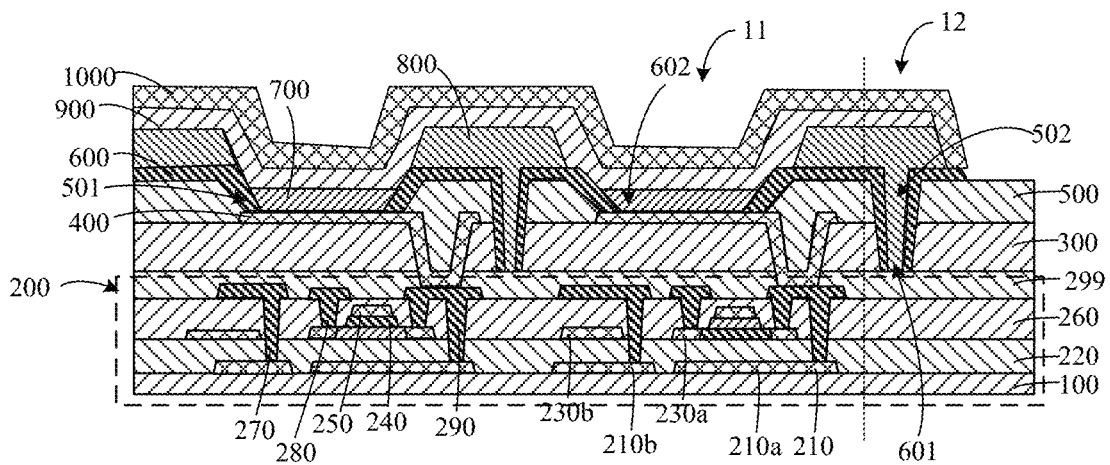
Figure 12:
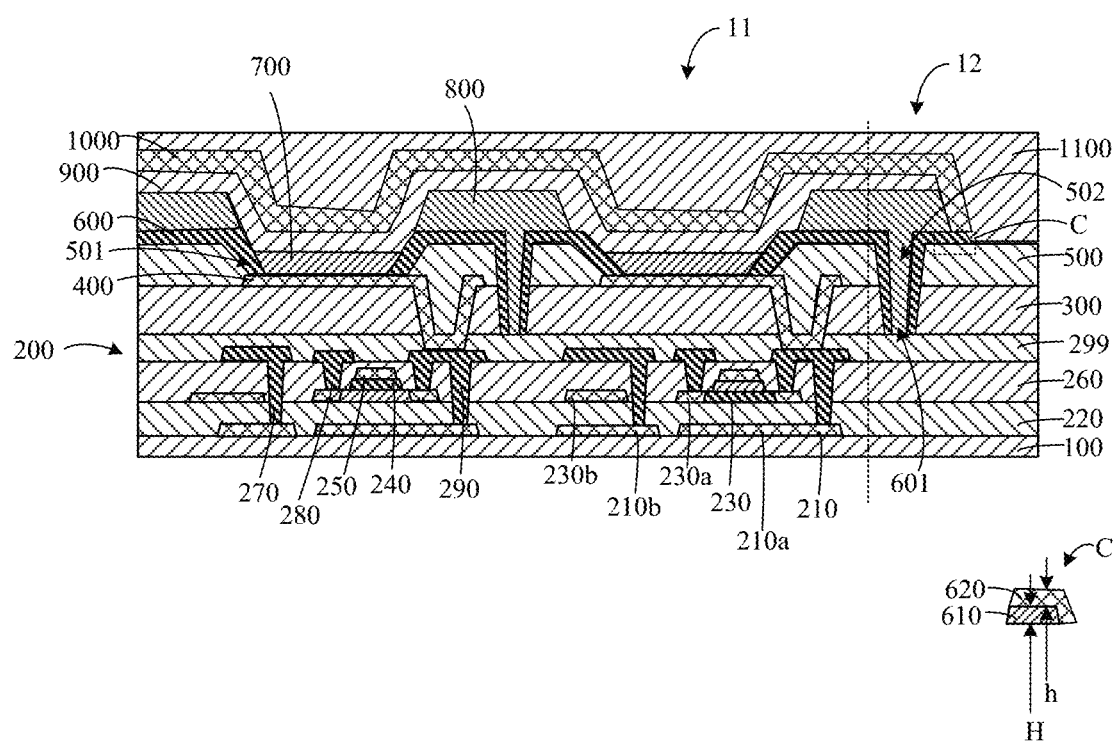

In an embodiment, after B14, the method further includes:

Referring to FIG. 11 and FIG. 12, an electron transport layer in the electron functional layer 900 is formed on the oxide layer 620, the light-emitting layer 700 and the self-repairing layer 800; then, an electron injection layer in the electron functional layer 900 is formed on the electron transport layer; then, an upper electrode 1000 is formed on the electron injection layer; and then, the encapsulation layer 1100 is formed on the upper electrode 1000.

In one embodiment, an end C of the upper electrode 1000 away from the light-emitting layer 700 is connected to the oxide layer 620.

The present application provides a display panel 10. By disposing an isolation layer 600 between the light-emitting layer 700 and the pixel definition layer 500, gases such as water and oxygen in the pixel definition layer 500 is prevented from entering the light-emitting layer 700, thereby preventing the light-emitting layer 700 from failure, and preventing the shrinkage problem of the pixel, thus improving a performance of the display panel 10; the self-repairing layer 800 is disposed in the display panel 10, so that the self-repairing layer 800 can repair the cracks in the display panel 10 during use or preparation process, thereby improving the bending performance of the display panel 10, thus improving the performance of the display panel 10.

The display panel and the manufacturing method thereof provided by the embodiments of the present application have been described in detail above. Specific examples are used to explain the principle and implementation of the present application. The descriptions of the above embodiments are only used to help understand the present application. Also, for those skilled in the art, according to the ideas of the present application, there will be changes in the specific implementation and application scope. In summary, the content of this specification should not be construed as limiting the present application.

What is claimed is:

1. A display panel, comprising:
   a substrate;
   a pixel definition layer, wherein the pixel definition layer is disposed on the substrate, the pixel definition layer is provided with a first through hole, and the first through hole penetrates the pixel definition layer; and
   light-emitting layers, wherein each of the light-emitting layers is disposed in the first through hole, and an isolation layer is disposed between the light-emitting layers and the pixel definition layer;
   wherein the isolation layer comprises a metal layer; and
   wherein the display panel is provided with a display area and a non-display area defined around the display area, the isolation layer further comprises an oxide layer that is insulative, the oxide layer is disposed on a side of the metal layer away from the substrate, and the oxide layer is located at an end of the metal layer away from the display area, the display panel further comprises an upper electrode and an electronic function layer, the electronic function layer is disposed on the light-emitting layers and the metal layer, the upper electrode is disposed on the electronic function layer and the oxide layer, and an end of the upper electrode away from the display area is connected to the oxide layer.

2. The display panel according to claim 1, wherein the oxide layer is made of a metal oxide of a material of the metal layer, and the metal layer and the oxide layer are integrally formed.

3. The display panel according to claim 1, wherein the isolation layer covers the pixel definition layer and fills the first through hole.

4. The display panel according to claim 3, wherein a first via hole is defined in the isolation layer, the first via hole is located between adjacent ones of the light-emitting layers, and the first via hole penetrates the isolation layer.

5. The display panel according to claim 4, wherein the display panel further comprises a transistor layer, a planarization layer, and a self-repairing layer, the transistor layer is disposed on the substrate, the planarization layer is disposed on the transistor layer, the pixel definition layer is disposed on the planarization layer, the pixel definition layer is further provided with a second through hole, the display panel is provided with a display area and a non-display area defined around the display area, the second through hole is defined in at least one of the display area or the non-display area, the second through hole is spaced apart from the first through hole, the second through hole communicates with the first via hole, and the second through hole penetrates the pixel definition layer and the planarization layer to expose the transistor layer, the isolation layer extends into the second through hole to contact the transistor layer, and the self-repairing layer is disposed on the isolation layer and extends into the second through hole to contact the transistor layer.

6. The display panel according to claim 1, wherein the isolation layer covers a sidewall of the first through hole.

7. The display panel according to claim 1, wherein the display panel further comprises a transistor layer and a self-repairing layer, the transistor layer is disposed on the substrate, the pixel definition layer is disposed on the transistor layer, and the self-repairing layer is disposed in the transistor layer or on the isolation layer.

8. The display panel according to claim 7, wherein the self-repairing layer comprises a self-repairing material, and the self-repairing material comprises one or a combination of a microcapsule self-repairing polymer material, a hollow fiber self-repairing polymer material, a nanoparticle self-repairing material, and a microvascular self-repairing polymer material.

9. The display panel according to claim 8, wherein the self-repairing layer further comprises a curing agent, the curing agent comprises one or a combination of aliphatic amine, mercaptan, boron trifluoride, polythiol-pentaerythritol tetramercaptopropionate, benzyldimethylamine, azobisisobutyronitrile (AIBN), and metal ruthenium (Grubbs).

10. The display panel according to claim 8, wherein a surface of the self-repairing layer away from the substrate is a hydrophobic surface.

11. The display panel according to claim 10, wherein the hydrophobic surface is made of a hydrophobic material, and a mass ratio of the hydrophobic material to a repairing agent is 1-5%: 1.

12. The display panel according to claim 1, wherein the display panel further comprises a transistor layer and a self-repairing layer, the self-repairing layer and the transistor layer are sequentially stacked on the substrate.

13. The display panel according to claim 1, wherein the display panel further comprises a transistor layer and a self-repairing layer, and the transistor layer, the self-repairing layer, and the pixel definition layer are sequentially stacked on the substrate.

* * * * *